United States Patent
Lee et al.

(10) Patent No.: US 8,848,432 B2
(45) Date of Patent: Sep. 30, 2014

(54) MAGNETORESISTIVE ELEMENTS AND MEMORY DEVICES INCLUDING THE SAME

(75) Inventors: Sung-chul Lee, Osan-si (KR);
Kwang-seok Kim, Seongnam-si (KR);
Kee-won Kim, Suwon-si (KR);
Young-man Jang, Hwaseong-si (KR);
Ung-hwan Pi, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 128 days.

(21) Appl. No.: 13/591,809

(22) Filed: Aug. 22, 2012

(65) Prior Publication Data
US 2013/0161769 A1    Jun. 27, 2013

(30) Foreign Application Priority Data
Dec. 21, 2011    (KR) .................. 10-2011-0139219

(51) Int. Cl.
*G11C 11/16* (2006.01)
*G11C 11/15* (2006.01)
*H01L 43/08* (2006.01)

(52) U.S. Cl.
CPC .............. *G11C 11/161* (2013.01); *H01L 43/08* (2013.01); *G11C 11/15* (2013.01)
USPC ..... 365/158; 365/171; 257/421; 257/E43.004

(58) Field of Classification Search
CPC ........ G11C 11/14; G11C 11/15; G11C 11/16; G11C 11/161; H01L 43/08; H01L 27/222; H01L 27/224
USPC .................. 365/158, 171; 257/421, E43.001, 257/E43.004, E29.323, E21.665
See application file for complete search history.

(56) References Cited

U.S. PATENT DOCUMENTS

| | | | |
|---|---|---|---|
| 7,502,253 B2 | 3/2009 | Rizzo | |
| 7,935,435 B2 * | 5/2011 | Gao et al. ................... | 428/811.1 |
| 7,940,600 B2 | 5/2011 | Dimitrov et al. | |
| 2007/0007609 A1 * | 1/2007 | Saito et al. ..................... | 257/421 |

FOREIGN PATENT DOCUMENTS

| KR | 20080033846 A | 4/2008 |
|---|---|---|
| KR | 20110019886 A | 3/2011 |

* cited by examiner

*Primary Examiner* — Allison P Bernstein
(74) *Attorney, Agent, or Firm* — Harness, Dickey & Pierce, P.L.C.

(57) ABSTRACT

Magnetoresistive elements, and memory devices including the same, include a free layer having a changeable magnetization direction, a pinned layer facing the free layer and having a fixed magnetization direction, and an auxiliary element on a surface of the pinned layer. The auxiliary element has a width smaller than a width of the pinned layer, and a magnetization direction fixed to a direction the same as a direction of the fixed magnetization direction of the pinned layer.

24 Claims, 13 Drawing Sheets

MAGNETORESISTIVE ELEMENTS AND MEMORY DEVICES INCLUDING THE SAME

CROSS-REFERENCE TO RELATED APPLICATIONS

This application claims the benefit of priority from Korean Patent Application No. 10-2011-0139219, filed on Dec. 21, 2011, in the Korean Intellectual Property Office, the disclosure of which is incorporated herein by reference in its entirety.

BACKGROUND

1. Field

Example embodiments relate to magnetoresistive elements and memory devices including the same.

2. Description of the Related Art

Magnetic random access memory (MRAM) is a memory device which stores data by using a resistance change of a magnetic tunneling junction (MTJ element. The resistance of the MTJ element depends on the magnetization direction of a free layer. In other words, when the magnetization direction of the free layer is identical with that of a pinned layer, the MTJ element has a low resistance value. When the magnetization direction of the free layer is opposite to that of the pinned layer, the MTJ element has a high resistance value. When the MTJ element has low resistance, the MTJ element may correspond to data '0'. When the MTJ element has high resistance, the MTJ element may correspond to data '1'. This MRAM attracts attention as one of the next-generation non-volatile memory devices due to its merits such as non-volatility, high-speed operation, and high endurance.

To increase a recording density of MRAM (i.e., to obtain a high-density MRAM), the size of the MTJ element needs to be reduced. However, when the width of the MTJ element is reduced to less than several tens of nanometers (nm), the intensity of a stray field generated from a pinned layer may be greatly increased, and thus may adversely affect the switching characteristics (i.e., magnetization inversion) of a free layer. Therefore, switching asymmetry of the free layer may occur and it may cause a serious problem in an operation of the MRAM. For this reason, it is not easy to increase the recording density of the MRAM to a certain level or greater.

SUMMARY

Example embodiments relate to magnetoresistive elements and memory devices including the same.

Provided are magnetoresistive elements suitable to be scaled down.

Provided are magnetoresistive elements that contribute to high integration and high performance of devices (for example, memory devices).

Provided are magnetoresistive elements capable of reducing a stray field of a pinned layer and securing high thermal stability.

Provided are devices (for example, memory devices) including the magnetoresistive elements.

Additional aspects will be set forth in part in the description which follows and, in part, will be apparent from the description, or may be learned by practice of the presented example embodiments.

According to example embodiments, a magnetoresistive element includes a free layer having a changeable magnetization direction, a pinned layer facing the free layer and having a fixed magnetization direction, and an auxiliary element on a surface of the pinned layer. The auxiliary element has a width smaller than a width of the pinned layer and a magnetization direction fixed to a direction the same as a direction of the magnetization direction of the pinned layer.

The free layer and the pinned layer may have perpendicular magnetic anisotropy.

The auxiliary element may have a magnetization easy axis perpendicular to an upper surface or a lower surface of the pinned layer.

The auxiliary element may be perpendicular to an upper surface or a lower surface of the pinned layer.

The pinned layer may have a thickness equal to, or less than, about 10 nm.

The auxiliary element may have a thickness equal to, or greater than, about 5 nm.

The auxiliary element may have a width equal to, or less than, about 10 nm.

A plurality of the auxiliary elements may be on the pinned layer.

The pinned layer may be a first pinned layer, and the magnetoresistive element may further include a second pinned layer on a surface of the first pinned layer, and a spacer between the first pinned layer and the second pinned layer.

The first pinned layer, the second pinned layer, and the spacer may collectively constitute a synthetic antiferromagnetic (SAF) structure.

A thickness of the second pinned layer may be greater than a thickness of the first pinned layer.

A plurality of the auxiliary elements may be on the surface of the first pinned layer. The plurality of auxiliary elements may include a first auxiliary element on a side of the second pinned layer, and a second auxiliary element on another side of the second pinned layer.

The magnetoresistive element may further include a separation layer between the free layer and the pinned layer. The separation layer may include an insulation layer.

The insulation layer may include at least one of a magnesium (Mg) oxide and an aluminum (Al) oxide.

The pinned layer may be on the free layer, and the auxiliary element may be on an upper surface of the pinned layer. The pinned layer may be below the free layer, and the auxiliary element may be on a lower surface of the pinned layer.

According to example embodiments, a magnetic device or an electronic device includes the above-described magnetoresistive elements.

According to example embodiments, a memory device includes at least one memory cell, wherein the at least one memory cell includes the above-described magnetoresistive element.

The at least one memory cell may further include a switching element connected to the magnetoresistive element.

The free layer and the pinned layer of the magnetoresistive element may have perpendicular magnetic anisotropy.

A plurality of the auxiliary elements may be provided on a surface of the pinned layer.

The pinned layer of the magnetoresistive element may be a first pinned layer, and the memory device may further include a second pinned layer on a surface of the first pinned layer, and a spacer between the first pinned layer and the second pinned layer.

The first pinned layer, the second pinned layer, and the spacer may collectively constitute a synthetic antiferromagnetic (SAF) structure.

The memory device may be a magnetic random access memory (MRAM).

The memory device may be a spin transfer torque magnetic random access memory (STT-MRAM).

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
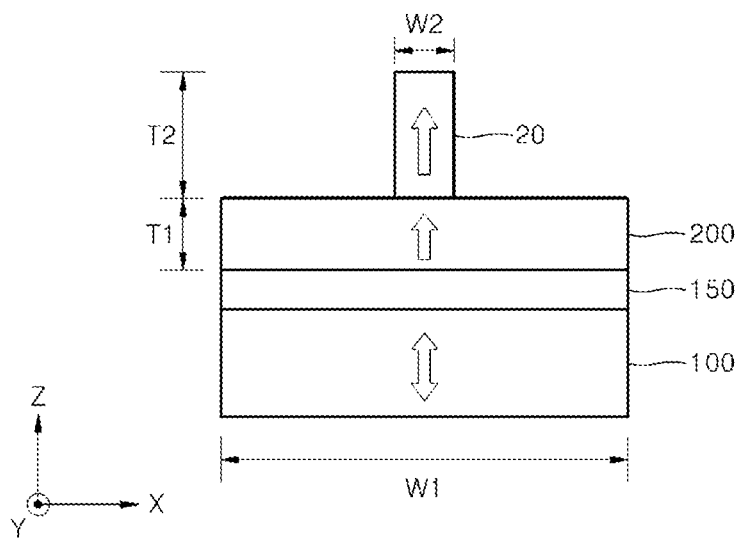
FIGS. 1 through 5 are cross-sectional views of magnetoresistive elements according to example embodiments.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example embodiments relate to magnetoresistive elements and memory devices including the same.

A magnetoresistive element and a device (memory device) including the same according to example embodiments will now be described more fully with reference to the accompanying drawings. In the drawings, the widths and thicknesses of layers and regions are exaggerated for clarity. Like reference numerals in the drawings denote like elements.

FIG. 1 is a cross-sectional view of a magnetoresistive element according to example embodiments.

Referring to FIG. 1, the magnetoresistive element may include a free layer 100, a pinned layer 200, and a separation layer 150 interposed between the free layer 100 and the pinned layer 200. The free layer 100 is a magnetic layer having a changeable (variable) magnetization direction, and may be formed of a ferromagnetic material. The ferromagnetic material may include at least one of cobalt (Co), iron (Fe), and nickel (Ni), and may further include at least one other element, such as boron (B), chromium (Cr), platinum (Pt), and palladium (Pd). A thickness of the free layer 100 may be equal to or less than about 10 nm, for example, equal to or less than about 5 nm. The pinned layer 200 is a magnetic layer having a fixed magnetization direction, and may be formed of a ferromagnetic material including at least one of Co, Fe, and Ni, for example. The ferromagnetic material may further include at least one other element, such as B, Cr, Pt, and Pd. The pinned layer 200 may be formed of a different material than the free layer 100, or may be formed of the same material as the free layer 100. A thickness of the pinned layer 200 may be equal to or less than about 10 nm, for example, equal to or less than about 5 nm. The separation layer 150 may be formed of an insulation material. For example, the separation layer 150 may include an insulation material such as a magnesium (Mg) oxide or an aluminum (Al) oxide. When these materials (particularly, Mg oxide) are used to form the separation layer 150, a magnetoresistance ratio (i.e., MR ratio) may be increased. However, the material of the separation layer 150 is not limited to an insulation material. In some cases, the separation layer 150 may be formed of a conductive material. In this case, the separation layer 150 may include at least one conductive material (metal) selected from ruthenium (Ru), copper (Cu), aluminum (Al), gold (Au), silver (Ag), and a mixture thereof. A thickness of the separation layer 150 may be no greater than about 5 nm, for example, no greater than about 3 nm.

An auxiliary element 20 may be provided on a surface (i.e., an upper surface) of the pinned layer 200. A width W2 of the auxiliary element 20 may be less than a width W1 of the pinned layer 200. The widths W1 and W2 of the pinned layer 200 and the auxiliary element 20 may be widths in a desired direction, for example, an X-axis direction. The width W1 of the pinned layer 200 may be, for example, equal to or less than about 40 nm or equal to or less than about 20 nm. The width W2 of the auxiliary element 20 may be, for example, equal to or less than about 10 nm. A thickness T2 (i.e., a height) of the auxiliary element 20 may be greater than the width W2 of the auxiliary element 20. The auxiliary element 20 may have a structure perpendicular to the pinned layer 200.

The auxiliary element 20 may be a magnetic element having a fixed magnetization direction. The magnetization direction of the auxiliary element 20 may be fixed to the same direction as the magnetization direction of the pinned layer 200. Because the auxiliary element 20, having the magnetization direction fixed to the same direction as the magnetization direction of the pinned layer 200, contacts the pinned layer 200, the magnetization direction of the pinned layer 200 may maintain a fixed state without being easily changed by heat. In other words, the auxiliary element 20 may improve the thermal stability of the pinned layer 200. This will be described in more detail later. Because the auxiliary element 20 may have magnetic characteristics similar to or the same as those of the pinned layer 200, the pinned layer 200 and the auxiliary element 20 may constitute a "pinned layer structure." The pinned layer structure may have a three-dimensional structure including the pinned layer 200 and the auxiliary element 20 protruding in a direction perpendicular to the pinned layer 200. A material used to form the auxiliary element 20 may be the same as or different from that used to form the pinned layer 200.

Hereinafter, the free layer 100, the pinned layer 200, and the auxiliary element 20 will be described in more detail.

The free layer 100 and the pinned layer 200 may have perpendicular magnetic anisotropy. In this case, the free layer 100 and/or the pinned layer 200 may include a Co-based material and may have a single-layered or multi-layered structure. For example, the free layer 100 and/or the pinned layer 200 may include at least one of Co, CoFe, CoFeB, CoCr, and CoCrPt, or may include a [Co/Pd]n structure, a [Co/Ni]n structure, a [Co/Pt]n structure, or the like. In the [Co/Pd]n structure, n denotes the number of times alternate stacking of Co and Pd is repeated. The same concept is applied to the [Co/Ni]n and [Co/Pt]n structures. As a concrete example, the free layer 100 may include CoFeB, and the pinned layer 200 may include the [Co/Pd]n structure. As such, the free layer 100 and the pinned layer 200 may have different materials/compositions. However, in some cases, the free layer 100 and the pinned layer 200 may have the same material/composition. The auxiliary element 20 may have perpendicular magnetic anisotropy, like the free layer 100 and the pinned layer 200. When the auxiliary element 20 has perpendicular magnetic anisotropy, the auxiliary element 20 may be formed of a material similar to or the same as the material used to form the pinned layer 200. When the auxiliary element 20 does not have perpendicular magnetic anisotropy, the material of the auxiliary element 20 may be different from that of the pinned layer 200. In this case, the auxiliary element 20 may be formed of a soft magnetic material such as NiFe. When the auxiliary element 20 is formed of a soft magnetic material, the magnetization easy axis of the auxiliary element 20 may be determined by shape anisotropy. In this context, the auxiliary element 20 may have a shape perpendicular to the pinned layer 200. Due to this shape, the magnetization easy axis of the auxiliary element 20 may be determined to be a direction perpendicular to the pinned layer 200, and the magnetization direction of the auxiliary element 20 may be fixed to the direction perpendicular to the pinned layer 200. As such, even when the auxiliary element 20 does not have perpendicular magnetic anisotropy, the magnetization easy axis of the auxiliary element 20 may be perpendicular to the pinned layer 200. Thus, the auxiliary element 20 may have a magnetization direction fixed to the same direction (vertical direction) as the magnetization direction of the pinned layer 200. Arrows indicated in the free layer 100, the pinned layer 200, and the auxiliary element 20 denote magnetization directions that they may have. The free layer 100 may be magnetized in the Z-axis direction or a reverse direction to the Z-axis direction. In other words, the magnetization direction of the free layer 100 may be reversed between the Z-axis direction and the reverse direction to the Z-axis direction. The pinned layer 200 may have a magnetization direction fixed to a direction parallel to the Z-axis, for example, the Z-axis direction. In this case, the magnetization direction of the auxiliary element 20 may be fixed to the Z-axis direction. The above-described magnetization directions of the free layer 100, the pinned layer 200, and the auxiliary element 20 are only examples, and may be changed.

The width W1 of the pinned layer 200 may be no greater than several tens of nm, which is small. As described above, the width W1 of the pinned layer 200 may be no greater than about 40 nm or no greater than about 20 nm. The free layer 100 may have a width which is the same as (or similar to) that of the pinned layer 200. The width W1 of the pinned layer 200 may correspond to the width of the magnetoresistive element. The thickness T1 of the pinned layer 200 may be small and may be equal to or less than about 10 nm, for example, equal to or less than about 5 nm. As such, because the thickness T1 of the pinned layer 200 is small, a stray field generated in the pinned layer 200 may have a small intensity.

The width W2 of the auxiliary element 20 may be less than the width W1 of the pinned layer 200. For example, the width W2 of the auxiliary element 20 may be equal to or less than about 10 nm or equal to or less than about 5 nm. The thickness T2 (i.e., a height) of the auxiliary element 20 may be equal to or less than about 100 nm, for example, may be about 5 nm to 100 nm. As described above, the magnetization direction of the pinned layer 200 may be stably fixed due to the auxiliary element 20. Because the auxiliary element 20, having the magnetization direction fixed to the same direction as the magnetization direction of the pinned layer 200, contacts the pinned layer 200, the magnetization direction of the pinned layer 200 may maintain a fixed state without being easily changed by heat. In other words, the auxiliary element 20 may improve the thermal stability of the pinned layer 200. As the thickness T2 of the auxiliary element 20 increases, the thermal stability of the pinned layer 200 may be improved. When the thickness T2 of the auxiliary element 20 is equal to or greater than about 5 nm, or equal to or greater than about 10 nm, the pinned layer 200 may have good thermal stability. Because the auxiliary element 20 is relatively farther from the free layer 100 than the pinned layer 200, a stray field generated in the auxiliary element 20 may not affect the free layer 100.

When the pinned layer 200 is thin, the intensity of the stray field generated in the pinned layer 200 may be decreased, but the thermal stability of the pinned layer 200 may be degraded. However, in the present example embodiments, the thermal stability of the pinned layer 200 may be easily obtained by using the auxiliary element 20. If the pinned layer 200 having a small thickness is used without using the auxiliary element 20, the stray field generated in the pinned layer 200 may have a small intensity, but the magnetization direction of the pinned layer 200 may be easily changed by heat. When increasing the thickness of the pinned layer 200 without using the auxiliary element 20, the thermal stability of the pinned layer 200 may be secured, but the intensity of the stray field generated in the pinned layer 200 may be increased. In this case, the stray field generated in the pinned layer 200 may adversely affect the switching characteristics of the free layer 100. In the present example embodiments, by using the pinned layer 200 having a relatively small thickness and placing the auxiliary element 20 on a surface (upper surface) of the pinned layer 200, the intensity of the stray field generated in (from) the pinned layer 200 may be decreased and at the same time the thermal stability of the pinned layer 200 may be secured. Therefore, according to the present example embodiments, problems due to the stray field of the pinned layer 200 may be suppressed/ prevented, and a magnetoresistive element having good thermal stability may be obtained.

In a conventional magnetoresistive element, a problem due to a stray field generated from a pinned layer may be worse as the size of the magnetoresistive element decreases. In other words, as the width of the magnetoresistive element decreases, the intensity of the stray field generated from the pinned layer may increase. This increase may adversely affect the switching characteristics of a free layer. For this reason, it may be difficult to reduce the width of the magnetoresistive element. However, in the magnetoresistive element according to the present example embodiments, the intensity of the stray field generated from the pinned layer 200 may be greatly reduced, and thus a problem due to the stray field may be suppressed/ prevented. Accordingly, according to example embodiments, the width (i.e., W1) of the magnetoresistive element may be easily reduced to less than several tens of nm, for example, less than about 40 nm or less than about 20 nm. In other words, the magnetoresistive element may be easily scaled down. When such a magnetoresistive element is applied to a device (for example, a memory device), a high-density/high-performance device may be manufactured.

According to example embodiments, a plurality of auxiliary elements 20 may be provided on the pinned layer 200 of FIG. 1. These example embodiments are illustrated in FIGS. 2 and 3.

Figure 2:
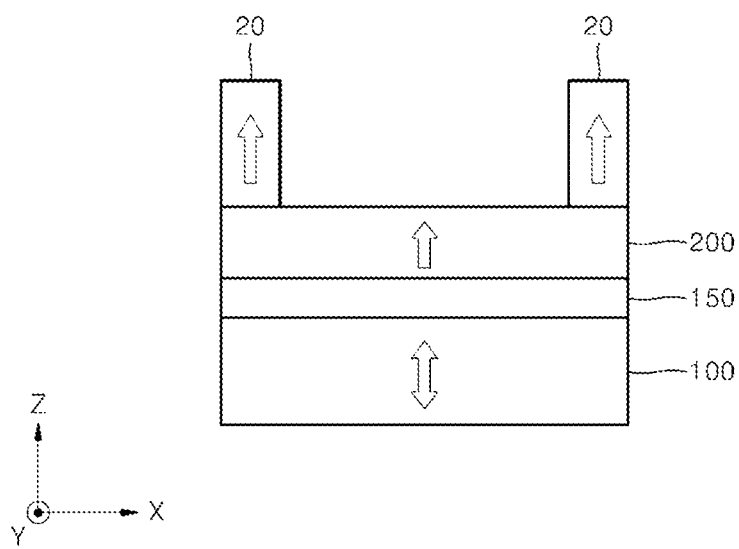
Figure 3:
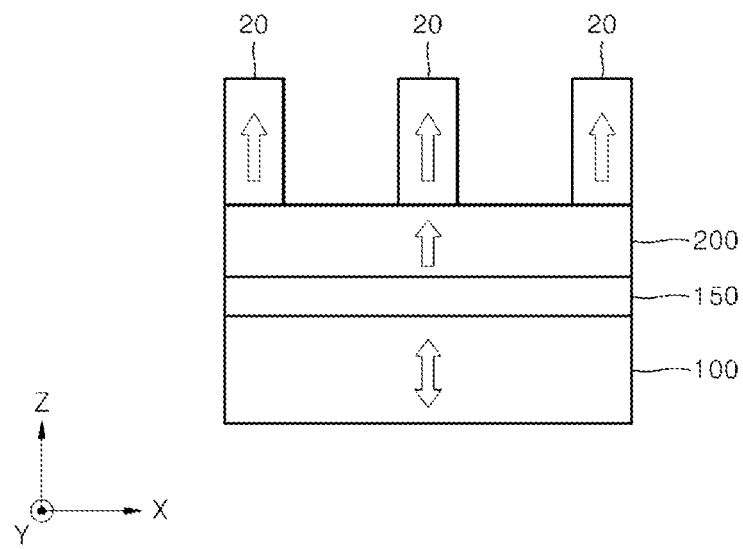

Referring to FIGS. 2 and 3, a plurality of auxiliary elements 20 may be provided on the pinned layer 200. FIG. 2 illustrates the case where two auxiliary elements 20 are provided, and FIG. 3 illustrates the case where three auxiliary elements 20 are provided. The auxiliary elements 20 may be regularly arrayed at regular intervals. As the number of auxiliary elements 20 increases, the thermal stability of the pinned layer 200 may be easily secured by the auxiliary elements 20.

The locations of the auxiliary elements 20 shown in FIGS. 1 through 3 are only examples, and may be changed variously. Although the auxiliary element 20 is located on the center portion of the pinned layer 200 in FIG. 1, the auxiliary element 20 may be disposed on a left or right side of the center portion of the pinned layer 200. Although the two auxiliary elements 20 are located on both ends of the pinned layer 200 in FIG. 2, they may be disposed on regions other than the both ends. Although the three auxiliary elements 20 are disposed at equal intervals in FIG. 3, the intervals (distances) between the auxiliary elements 20 may be varied. In some cases, four or more auxiliary elements 20 may be used.

Figure 4:
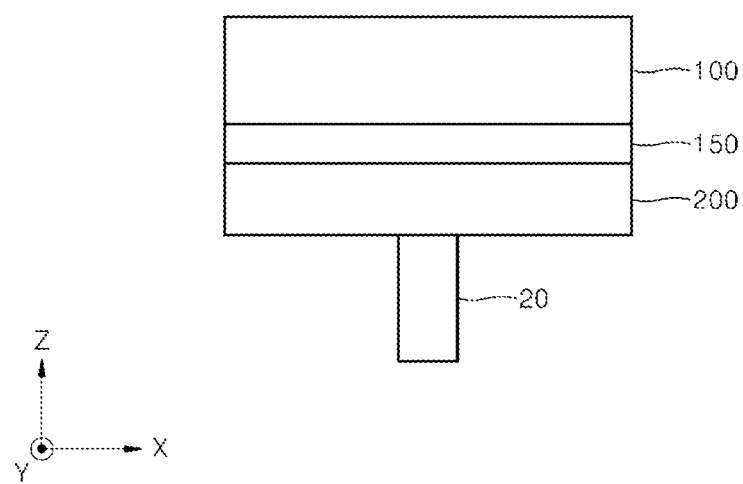

Although the pinned layer 200 is provided on the free layer 100 and one or more auxiliary elements 20 are provided on the upper surface of the pinned layer 200 in FIGS. 1 through 3, a location relationship among the free layer 100, the pinned layer 200, and the auxiliary element 20 may be changed. For example, the pinned layer 200 may be disposed under the free layer 100, and one or more auxiliary elements 20 may be provided on a lower surface of the pinned layer 200. An example thereof is illustrated in FIG. 4. The structure of FIG. 4 may be a structure obtained by turning the structure of FIG. 1 upside down (namely, a reversed structure of FIG. 1).

Figure 5:
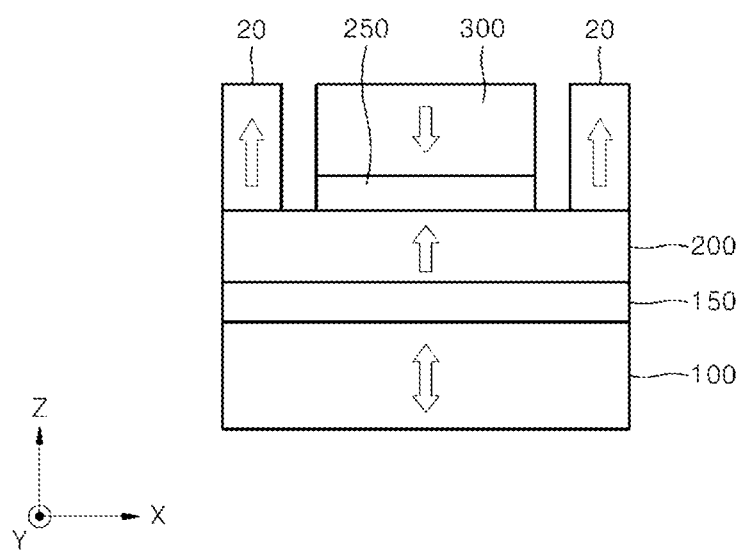

FIG. 5 is a cross-sectional view of a magnetoresistive element according to example embodiments.

Referring to FIG. 5, a free layer 100, a separation layer 150, and a pinned layer (hereinafter, referred to as a first pinned layer) 200 may be sequentially stacked, and at least one auxiliary element 20 may be disposed on the first pinned layer 200. The materials/compositions/dimensions of the free layer 100, the separation layer 150, the first pinned layer 200, and the auxiliary elements 20 may be the same as or similar to those of the free layer 100, the separation layer 150, the pinned layer 200, and the auxiliary element 20 of FIG. 1, and thus descriptions thereof will be omitted. A second pinned layer 300 spaced apart from the auxiliary elements 20 may be provided on a surface (i.e., an upper surface) of the first pinned layer 200. A spacer 250 may be provided between the first pinned layer 200 and the second pinned layer 300. The spacer 250 and the second pinned layer 300 may have smaller widths than the first pinned layer 200. The second pinned layer 300 may have a magnetization direction fixed to the opposite direction to the magnetization direction of the first pinned layer 200. Thus, the first pinned layer 200, the spacer 250, and the second pinned layer 300 may constitute a synthetic antiferromagnetic (SAF) structure. In this SAF structure, the first and second pinned layers 200 and 300 adjacent to each other with the spacer 250 disposed therebetween may have magnetization directions fixed in opposite directions. The material of the second pinned layer 300 may be the same as, or similar to, that of the first pinned layer 200. The thickness of the second pinned layer 300 may be greater than that of the first pinned layer 200, or may not be greater than that of the first pinned layer 200. The second pinned layer 300 may have a height which is the same as, or similar to, that of each of the auxiliary elements 20. The spacer 250 may include at least one of conductive materials such as Ru, Cu, Al, Au, Ag, and a mixture thereof, and the thickness of the spacer 250 may be equal to or less than about 5 nm, for example, equal to or less than about 3 nm. The auxiliary elements 20 may be disposed on both sides of a stack of the spacer 250 and the second pinned layer 300. The auxiliary element 20 disposed on a side of the second pinned layer 300 may be referred to as a first auxiliary element, and the auxiliary element 20 disposed on another side of the second pinned layer 300 may be referred to as a second auxiliary element.

As shown in FIG. 5, when the second pinned layer 300 having a magnetization direction fixed to the opposite direction to that of the first pinned layer 200 is used, the second pinned layer 300 may offset a stray field generated from the first pinned layer 200. In other words, the influence of the stray field of the first pinned layer 200 upon the free layer 100 may be weakened by the second pinned layer 300. This effect may increase as the second pinned layer 300 thickens. In this regard, the second pinned layer 300 may have a larger thickness than the first pinned layer 200. However, the thickness of the second pinned layer 300 is not necessarily greater than that of the first pinned layer 200. The thickness of the second pinned layer 300 may be the same as, or smaller than, that of the first pinned layer 200.

In the structure of FIG. 5, because the second pinned layer 300 weakens the stray field of the first pinned layer 200, the influence of the stray field upon the free layer 100 may be more effectively suppressed/prevented compared to the structures of FIGS. 1 through 4.

In addition, although the auxiliary elements 20 are symmetrically disposed on both sides of the second pinned layer 300 in the structure of FIG. 5, the number of auxiliary elements 20, the locations of the auxiliary elements 20, and intervals between the auxiliary elements 20 and the second pinned layer 300 may vary. For example, the auxiliary elements 20 on both sides of the second pinned layer 300 may have asymmetrical structures with respect to the second pinned layer 300. Only one auxiliary element 20 may be disposed on the first pinned layer 200, or three or more auxiliary elements 20 may be disposed thereon. Also, the structure of FIG. 5 may be turned upside down.

Figure 6A:
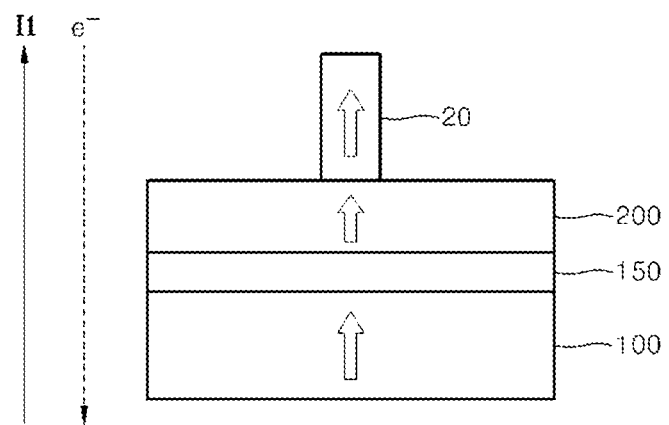
FIGS. 6A and 6B are cross-sectional views for explaining a method of operating a magnetoresistive element according to example embodiments.
Figure 6B:
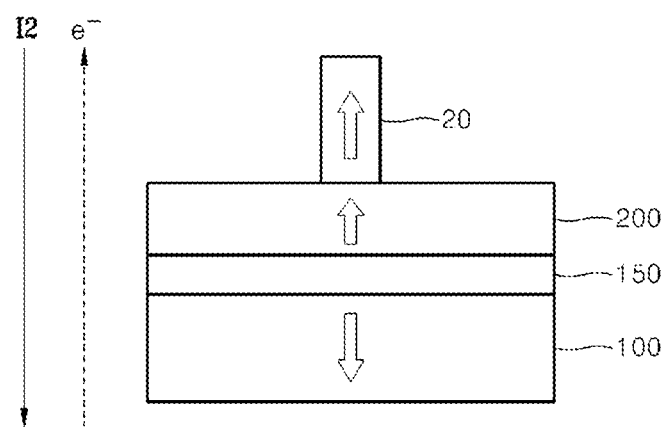

FIGS. 6A and 6B are cross-sectional views for explaining a method of operating a magnetoresistive element, according to example embodiments. This method is related to the magnetoresistive element of FIG. 1.

Referring to FIG. 6A, a first current I1 may be applied from the free layer 100 to the pinned layer 200. The first current I1 may flow from the free layer 100 to the auxiliary element 20 via the separation layer 150 and the pinned layer 200. Due to the first current I1, electrons e– may flow from the pinned layer 200 to the free layer 100. The electrons e-, which flow from the pinned layer 200 to the free layer 100, may have the same spin direction as the pinned layer 200 and apply a spin torque to the free layer 100. Accordingly, the free layer 100 may be magnetized in the same direction as that in which the pinned layer 200 is magnetized. The state in which the free layer 100 is magnetized in the same direction as the magnetization direction of the pinned layer 200 may be referred to as a parallel state, and the magnetoresistive element may have a low resistance (a first resistance).

Referring to FIG. 6B, a second current I2 may be applied from the pinned layer 200 to the free layer 100. The second current I2 may flow from the auxiliary element 20 to the free layer 100 via the pinned layer 200 and the separation layer 150. Due to the second current I2, electrons e– may flow from the free layer 100 to the pinned layer 200. Due to the electrons e– flowing from the free layer 100 to the pinned layer 200, the free layer 100 may be magnetized in a direction opposite to that in which the pinned layer 200 is magnetized. This is because, whereas electrons having the same spin as the pinned layer 200, among the electrons e– flowing to the pinned layer 200, flow out via the pinned layer 200, electrons having a spin opposite to that of the pinned layer 200 return to the free layer 100 and apply a spin torque to the free layer 100. In other words, because the electrons having a spin opposite to that of the pinned layer 200 apply a spin torque to the free layer 100, the free layer 100 may be magnetized in the opposite direction to the magnetization direction of the pinned layer 200. The state in which the free layer 100 is magnetized in the opposite direction to the magnetization direction of the pinned layer 200 may be referred to as an anti-parallel state, and the magnetoresistive element may have a high resistance (a second resistance).

As described above with reference to FIGS. 6A and 6B, the magnetization direction of the free layer 100 may be determined by the applied current I1 or I2. Because a spin torque of electrons is transferred to the free layer 100 due to the applied current I1 or I2, the free layer 100 may be magnetized in a desired direction, namely, the same direction as or the opposite direction to the magnetization direction of the pinned layer 200. Accordingly, the magnetization of the free layer 100 may be performed by a spin transfer torque.

Figure 7:
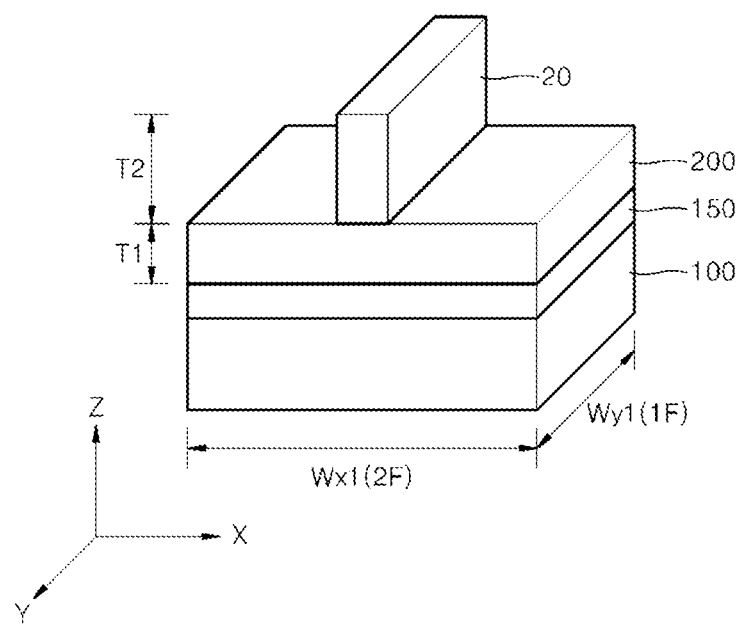
FIGS. 7 and 8 are perspective views showing three-dimensional structures of magnetoresistive elements according to example embodiments.
Figure 8:
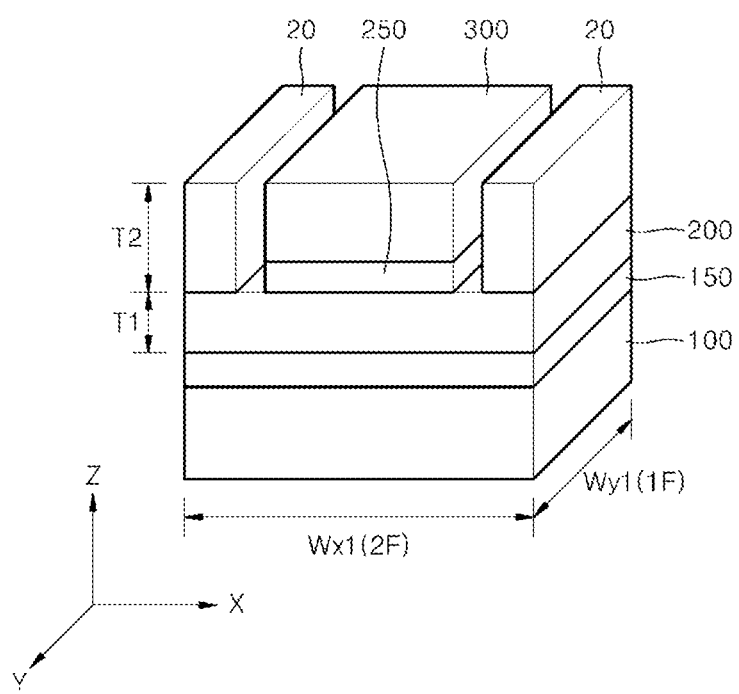

FIGS. 7 and 8 are perspective views showing three-dimensional structures of magnetoresistive elements according to example embodiments. FIG. 7 may be a perspective view of the magnetoresistive element of FIG. 1, and FIG. 8 may be a perspective view of the magnetoresistive element of FIG. 5.

Referring to FIGS. 7 and 8, the free layer 100, the separation layer 150, and the pinned layer 200 may have rectangular layer structures. Each auxiliary element 20 may protrude in a direction perpendicular to the pinned layer 200. When a width of the pinned layer 200 in the X-axis direction is Wx1 and a width thereof in the Y-axis direction is Wy1, the width Wy1 may be 1F and the width Wx1 may be 2F. Herein, F denotes a feature size. However, a ratio of the width Wx1 of the pinned layer 200 in the X-axis direction to the width Wy1 thereof in the Y-axis direction may vary. The auxiliary element 20 may have a width (the width W2 of FIG. 1) less than the width Wx1 of the pinned layer 200 in the X-axis direction, and may extend in the Y-axis direction. A width of the auxiliary element 20 in the Y-axis direction may be the same as or similar to the width Wy1 of the pinned layer 200. In FIG. 7, one auxiliary element 20 is disposed on the center portion of the pinned layer 200. In FIG. 8, the second pinned layer 300 is disposed between two auxiliary elements 20. The perspective views of FIGS. 7 and 8 are only examples, and may be changed variously. For example, the free layer 100, the separation layer 150, and the pinned layer 200 may have a circular or oval shape as seen from above. The structure of the auxiliary element 20 may be also changed variously. A length of the auxiliary element 20 in the Y-axis direction may be less than that of the pinned layer 200 in the Y-axis direction. The structure of the second pinned layer 300 may be also changed variously. Moreover, the structure of the magnetoresistive element may be modified variously.

Figure 9:
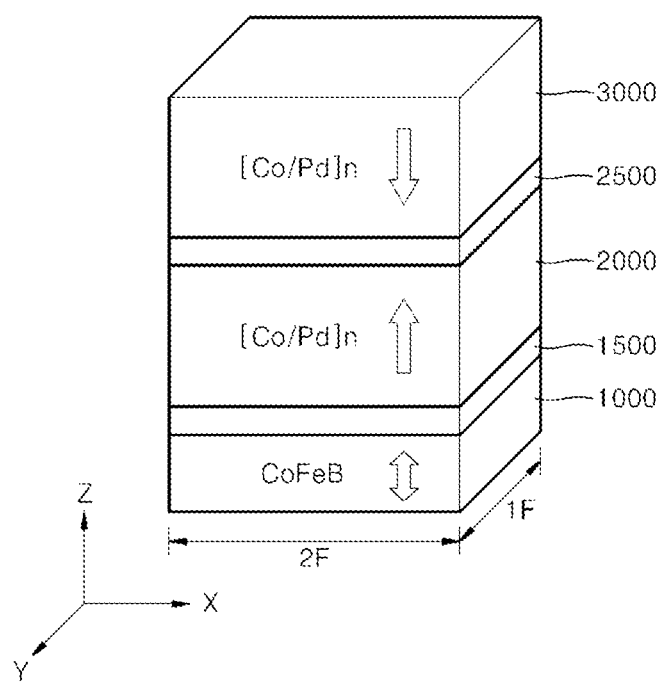
FIG. 9 is a perspective view of a magnetoresistive element according to a comparative example.

FIG. 9 is a perspective view of a magnetoresistive element according to a comparative example which is compared to example embodiments.

Referring to FIG. 9, a separation layer 1500, a first pinned layer 2000, a spacer 2500, and a second pinned layer 3000 are sequentially stacked on a free layer 1000. The free layer 1000 is a CoFeB layer, and each of the first and second pinned layers 2000 and 3000 may have a structure in which Co and Pd are alternately and repeatedly stacked, that is, a [Co/Pd]n structure. The free layer 1000 and the first and second pinned layers 2000 and 3000 have perpendicular magnetic anisotropy, and the magnetization direction of the first pinned layer 2000 is opposite to that of the second pinned layer 3000. The separation layer 1500 is MgO layer, and the spacer 2500 is Ru layer. A width of the magnetoresistive element according to the comparative example in the X-axis direction is 2F, and a width thereof in the Y-axis direction is 1F. Herein, F denotes a feature size.

Figure 10:
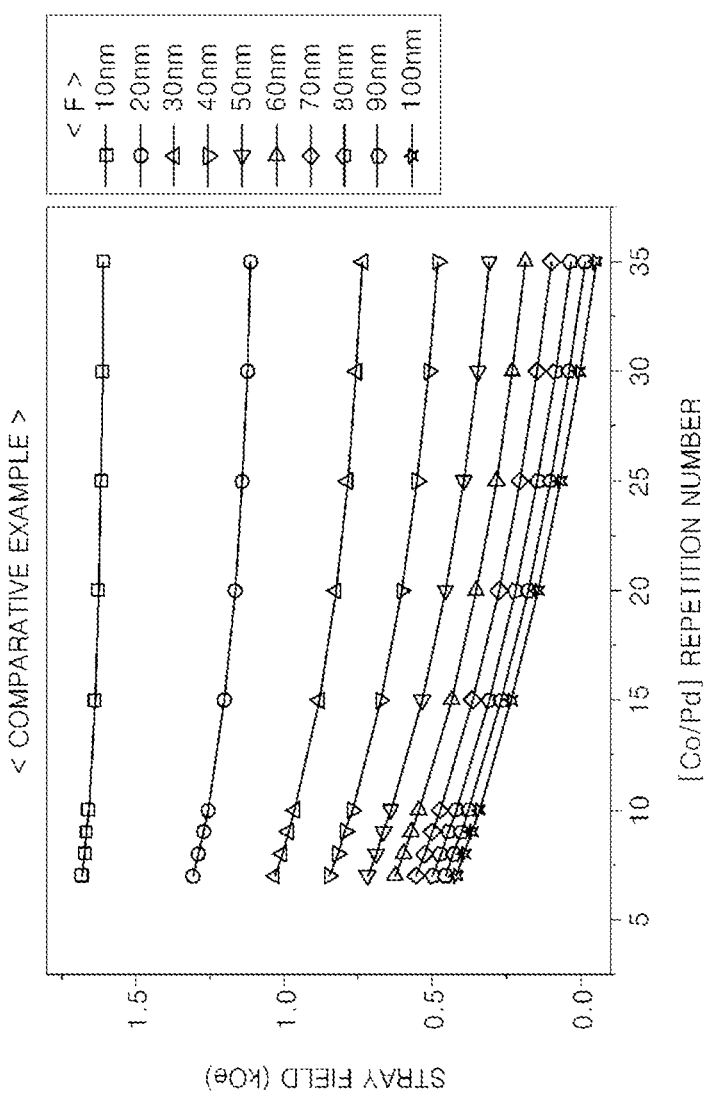
FIG. 10 is a graph showing a variation of a stray field of a first pinned layer according to a repetition number of [Co/Pd] at each of feature sizes F of the magnetoresistive element according to the comparative example of FIG. 9.

FIG. 10 is a graph showing a variation of a stray field of the first pinned layer 2000 according to a repetition number (namely, n) of stacking of [Co/Pd] at each of various feature sizes F of the magnetoresistive element according to the comparative example of FIG. 9.

Referring to FIG. 10, as the size of the feature size F decreases, the stray field greatly increases. In particular, when the feature size F is less than 20 nm, the stray field is over 1 kOe (namely, 1000 Oe), which is very high. When the feature size F is equal to or greater than 40 nm, the stray field decreases as the repetition number of [Co/Pd] (i.e., n) increases. However, when the feature size F is less than or equal to 20 nm, the stray field hardly decreases even when the repetition number of [Co/Pd] (i.e., n) increases. According to this result, when the size of the magnetoresistive element decreases to a certain level or less, the stray field of the first pinned layer 2000 greatly increases, and the stray field hardly decreases even when the thicknesses (i.e., repetition numbers) of the first and second pinned layers 2000 and 3000 increase. When a stray field is large as described above, switching asymmetry of the free layer 1000 may occur. This will be described below with reference to FIG. 11.

Figure 11:
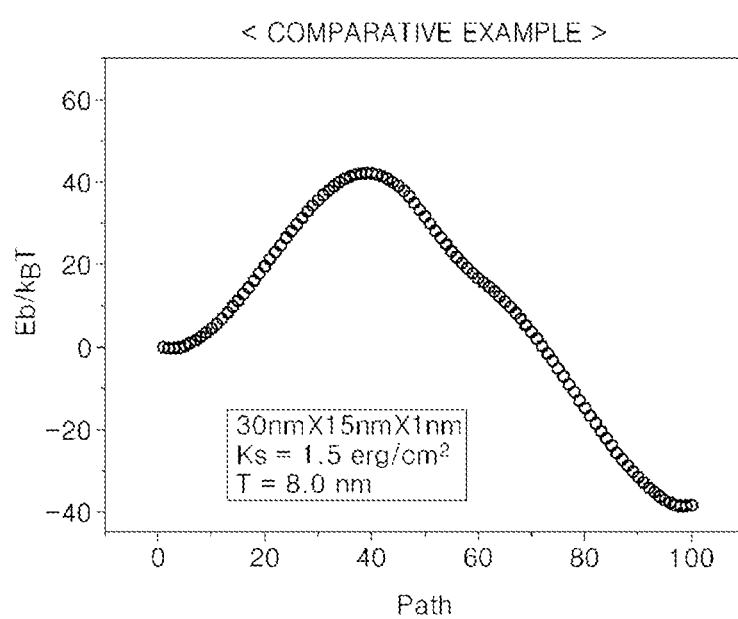
FIG. 11 is a graph showing a measurement result of an energy barrier Eb/kBT according to a switching path of a free layer of the magnetoresistive element according to the comparative example of FIG. 9.

FIG. 11 is a graph showing a measurement result of an energy barrier Eb/kBT according to a switching path of the free layer 1000 of the magnetoresistive element according to the comparative example of FIG. 9 when the feature size F is 15 nm and the first and second pinned layers 2000 and 3000 have a thickness of 8 nm. Here, kB denotes a Boltzmann constant and T denotes an absolute temperature. The thickness of the free layer 1000 is 1 nm, and a magnetic anisotropy energy Ks of the free layer 1000 is 1.5 erg/cm$^2$. The thicknesses of the separation layer 1500 and the spacer 2500 are 1 nm.

Referring to FIG. 11, the graph has relatively large asymmetry with respect to a vertical axis. In other words, a height of a lower point on the left side with respect to the uppermost point of the graph is greatly different from a height of a lower point on the right side. The lower point on the left side corresponds to the case where the free layer 1000 is magnetized to a first direction, and the lower point on the right side corresponds to the case where the free layer 1000 is magnetized to a second direction (a direction opposite to the first direction). The relatively large vertical asymmetry of the graph denotes the fact that an energy barrier when the magnetization direction of the free layer 1000 is changed from the first direction to the second direction is greatly different from an energy barrier when the magnetization direction of the free layer 1000 is changed from the second direction to the first direction. When a difference between the height at which the left-side lower point exists and the height at which the right-side lower point exists is ΔEb/kBT, the difference ΔEb/kBT is about 40, which is relatively large. The fact that the difference ΔEb/kBT is large denotes the fact that switching asymmetry of the free layer 1000 is large. Accordingly, the large difference ΔEb/kBT may cause a serious problem in a switching operation of the free layer 1000. The switching asymmetry is caused by a stray field which is applied from the first pinned layer 2000 to the free layer 1000.

Figure 12:
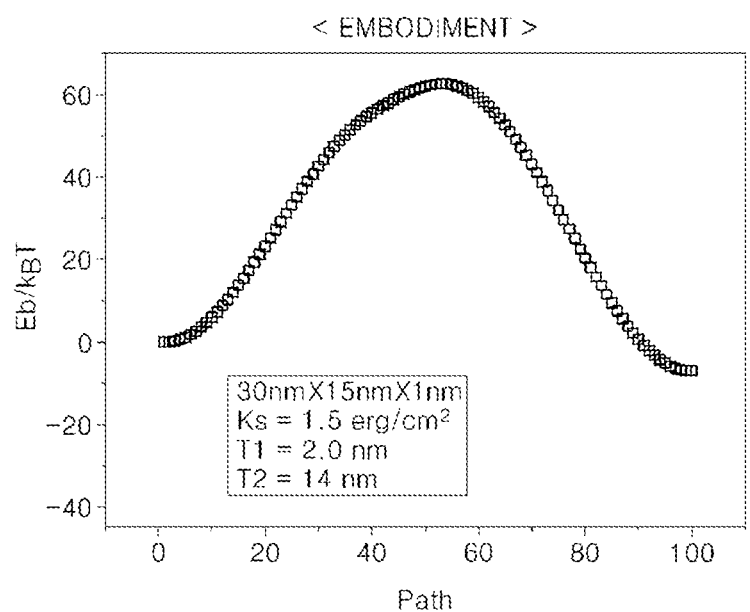
FIG. 12 is a graph showing a measurement result of an energy barrier Eb/kBT according to a switching path of a free layer of the magnetoresistive element according to the embodiment of FIG. 8.

FIG. 12 is a graph showing a measurement result of an energy barrier Eb/kBT according to a switching path of the free layer 100 of the magnetoresistive element according to the example embodiments of FIG. 8 when the feature size F is 15 nm, the thickness T1 of the first pinned layer 100 is 2 nm, and the thickness T2 of the auxiliary element 20 is 14 nm. The free layer 100, the separation layer 150, the first pinned layer 200, the spacer 250, and the second pinned layer 300 are formed of CoFeB (thickness: 1 nm), MgO (thickness: 1 nm), [Co/Pd]n (thickness: 2 nm), Ru (thickness: 1 nm), and [Co/Pd]n (thickness: 13 nm), respectively. The auxiliary element 20 is formed of [Co/Pd]n (thickness: 14 nm), and a width of the auxiliary element 20 in the X-axis direction is 3 nm. The magnetic anisotropy energy Ks of the free layer 100 is 1.5 erg/cm$^2$.

Referring to FIG. 12, the graph has relatively good symmetry with respect to a vertical axis. In other words, a height of a lower point on the left side with respect to the uppermost point of the graph is almost the same as a height of a lower point on the right side. In other words, the difference ΔEb/kBT is nearly 0. Thus, an energy barrier when the magnetization direction of the free layer 100 is changed from the first direction to the second direction is almost the same as an energy barrier when the magnetization direction of the free layer 100 is changed from the second direction to the first direction. According to this result, when a magnetoresistive element according to example embodiments as shown in FIG. 8 is used, although its size is small, switching asymmetry of the free layer 100 may not occur.

Figure 13:
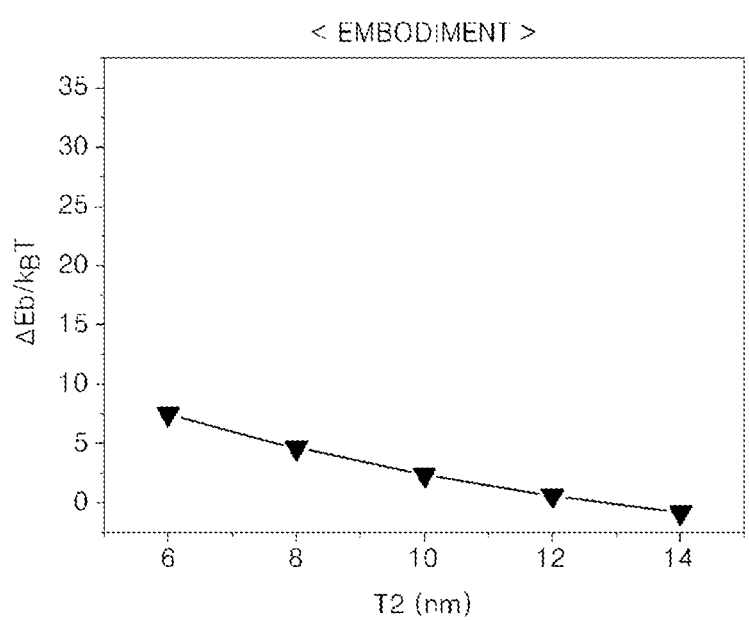
FIG. 13 is a graph showing a measurement result of ΔEb/kBT according to a variation of a thickness T2 of an auxiliary element of the magnetoresistive element according to the embodiment of FIG. 8.

FIG. 13 is a graph showing a measurement result of on ΔEb/kBT according to a variation of the thickness T2 of the auxiliary element 20 of the magnetoresistive element according to the embodiment of FIG. 8. The thickness T2 of the auxiliary element 20 is changed from 6 nm to 14 nm, and also the thickness of the second pinned layer 300 is increased. In other words, the thickness of the second pinned layer 300 is increased so that the auxiliary element 20 and the second pinned layer 300 have the same height. Hereinafter, T2 is referred to as the heights of the auxiliary element 20 and the second pinned layer 300. The materials, thicknesses, and the like of the remaining components excluding the height T2 of the auxiliary element 20 and the second pinned layer 300 are the same as those described above with reference to FIG. 12.

Referring to FIG. 13, as the height T2 of the auxiliary element 20 and the second pinned layer 300 increases, ΔEb/kBT gradually decreases. This means that the switching characteristics of the free layer 100 improve as the height T2 of the auxiliary element 20 and the second pinned layer 300 increases. Even when the height T2 of the auxiliary element 20 and the second pinned layer 300 is 6 nm, ΔEb/kBT is about 7, which is low. Considering that the difference ΔEb/kBT of the magnetoresistive element according to the comparative example described above with reference to FIG. 11 is about 40, the difference ΔEb/kBT of the magnetoresistive element according to the present example embodiments is very low. When the height T2 of the auxiliary element 20 and the second pinned layer 300 is 14 nm, the difference ΔEb/kBT is nearly 0.

Figure 14:
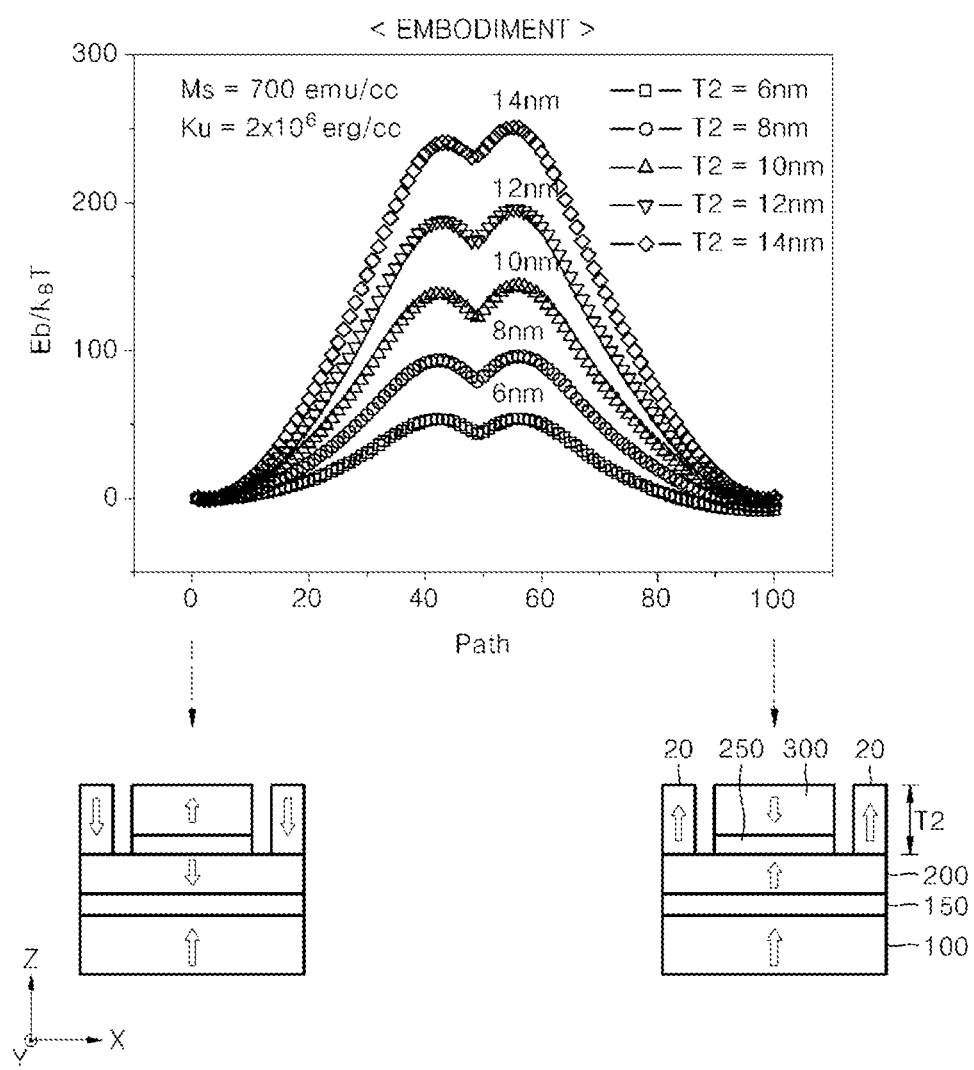
FIG. 14 is a graph showing a result of a simulation performed for evaluating the thermal stability of a pinned layer of a magnetoresistive element according to example embodiments.

FIG. 14 is a graph showing a result of a simulation performed for evaluating the thermal stability of a pinned layer of a magnetoresistive element according to example embodiments.

FIG. 14 is related with the magnetoresistive element of FIG. 8, in which the free layer 100, the separation layer 150, the first pinned layer 200, the spacer 250, and the second pinned layer 300 are formed of CoFeB (thickness: 1 nm), MgO (thickness: 1 nm), [Co/Pd]n (thickness: 2 nm), Ru (thickness: 1 nm), and [Co/Pd]n, respectively. The auxiliary element 20 is formed of [Co/Pd]n, and a width of the auxiliary element 20 in the X-axis direction is 3 nm. Saturation magnetization Ms of the first pinned layer 200 is 700 emu/cc, and a magnetic anisotropy energy Ku of the first pinned layer 200 is $2 \times 10^6$ erg/cc. When the thickness T2 of the auxiliary element 20 varies, a variation in an energy barrier according to the switching path of the first pinned layer 200 is measured. The thickness T2 of the auxiliary element 20 is changed from 6 nm to 14 nm, and also the thickness of the second pinned layer 300 is increased. In other words, the thickness of the second pinned layer 300 is increased so that the auxiliary element 20 and the second pinned layer 300 have the same height. Hereinafter, T2 is referred to as the heights of the auxiliary element 20 and the second pinned layer 300.

In FIG. 14, a case where the switching path is 0 corresponds to a case where the first pinned layer 200 is magnetized in the opposite direction to the Z-axis direction, and a case where the switching path is 100 corresponds to a case where the first pinned layer 200 is magnetized in the Z-axis direction. An energy barrier between the case where the switching path is 0 and the case where the switching path is 100 is an energy barrier for reversing the magnetization direction of the first pinned layer 200. The fact that the energy barrier is high denotes the fact that the thermal stability of the first pinned layer 200 is excellent. As the height T2 of the auxiliary element 20 and the second pinned layer 300 increases, the height of the energy barrier increases. When the height T2 of the auxiliary element 20 and the second pinned layer 300 is 6 nm, the energy barrier Eb/kBT is about 50. When the height T2 of the auxiliary element 20 and the second pinned layer 300 is 14 nm, the energy barrier Eb/kBT is about 250. Even when the energy barrier Eb/kBT is about 50, it may be considered that the thermal stability is somewhat secured. The thermal stability when the energy barrier Eb/kBT is about 250 is very high. As such, in the magnetoresistive element according to example embodiments, thermal stability of the pinned layer 200 may be secured by the auxiliary element 20, and the thermal stability may be improved to a very high level by increasing the thickness T2 of the auxiliary element 20.

The magnetoresistive element according to example embodiments may be applied to various magnetic devices and various electronic devices. For example, the magnetoresistive element may be applied to a memory cell of a memory device. As described above, because the magnetoresistive element according to example embodiments may be easily scaled down and may have good performance and high thermal stability, high-density/high-performance memory devices may be obtained by applying the magnetoresistive element. When the width of an existing (conventional) magnetoresistive element is reduced to about 40 nm or less, the stray field of a pinned layer greatly increases, causing switching asymmetry of a free layer. However, in a magnetoresistive element according to example embodiments, the stray field of a pinned layer may be greatly reduced, and thermal stability may be secured by an auxiliary element. Thus, a small-sized magnetoresistive element which is difficult to be obtained in an existing art may be easily realized. Accordingly, a high-density memory device having a large storage capacity per unit area may be manufactured by using this magnetoresistive element. The magnetoresistive element according to example embodiments may be applied to not only memory devices but also the other devices for various purposes.

Figure 15:
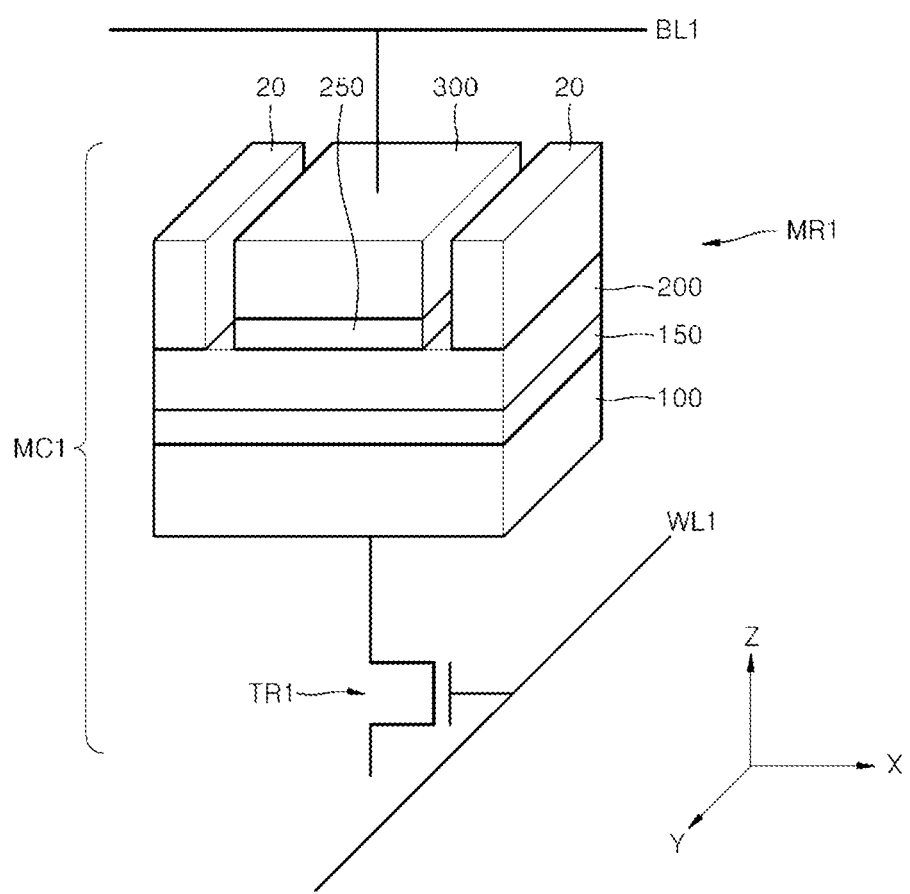
FIG. 15 illustrates a memory device including a magnetoresistive element, according to example embodiments.

FIG. 15 illustrates a memory device including a magnetoresistive element, according to example embodiments.

Referring to FIG. 15, the memory device may include a magnetoresistive element MR1 and a switching element TR1 connected to the magnetoresistive element MR1, in a memory cell MC1. The magnetoresistive element MR1 may have one of the structures described above with references to FIGS. 1 through 8, for example, the structure of FIG. 8. The switching element TR1 may be a transistor, for example.

The memory cell MC1 may be connected between a bit line BL1 and a word line WL1. The bit line BL1 and the word line WL1 may be disposed to intersect (cross) with each other, and the memory cell MC1 may be disposed at an intersection (cross-point) between the bit line BL1 and the word line WL1. The bit line BL1 may be connected to the magnetoresistive element MR1. The second pinned layer 300 of the magnetoresistive element MR1 may be electrically connected to the bit line BL1. Alternatively, the second pinned layer 300 and the two auxiliary elements 20 of the magnetoresistive element MR1 may be commonly connected to the bit line BL1. In some cases, only the two auxiliary elements 20 excluding the second pinned layer 300 may be commonly connected to the bit line BL1. Alternatively, the first pinned layer 200 of the magnetoresistive element MR1 may be directly connected to the bit line BL1. The word line WL1 may be connected to the switching element TR1. When the switching element TR1 is a transistor, the word line WL1 may be connected to a gate electrode of the switching element TR1. Via the word line WL1 and the bit line BL1, a write current, a read current, an erase current, and the like may be applied to the memory cell MC1.

Although one memory cell MC1 is illustrated in FIG. 15, a plurality of memory cells MC1 may be arranged to form an array. In other words, a plurality of bit lines BL1 and a plurality of word lines WL1 may be disposed to intersect with each other, and the memory cells MC1 may be respectively disposed at intersections between the bit lines BL1 and the word lines WL1. According to example embodiments, the size of the magnetoresistive element MR1 may be reduced to no greater than about 40 nm or no greater than about 20 nm, and thus the size of the memory cell MC1 may be significantly reduced. Consequently, high-density/highly-integrated memory devices may be realized.

The memory device of FIG. 15 may be a magnetic random access memory (MRAM). In particular, because the memory device of FIG. 15 uses the above-described spin transfer torque, the memory device may be referred to as a spin transfer torque MRAM (STT-MRAM). Unlike existing MRAM, the STT-MRAM does not require a conductive line (i.e., a digit line) for generating an external magnetic field, and thus is easily highly integrated and is simply operated.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims. For example, one of ordinary skill in the art would recognize various ways that the structures of the magnetoresistive elements of FIGS. 1 through 8 may be modified. Also, one of ordinary skill in the art would recognize that the magnetoresistive elements according to example embodiments may be applied to other memory devices as well as the memory device of FIG. 15, and to various magnetic devices other than memory devices. Therefore, the scope is defined not by the detailed description but by the appended claims, and all differences within the scope will be construed as being included in the example embodiments.

What is claimed is:

1. A magnetoresistive element, comprising:
    a free layer having a changeable magnetization direction;
    a pinned layer facing the free layer and having a fixed magnetization direction; and
    an auxiliary element on a surface of the pinned layer, the auxiliary element directly contacting the pinned layer,
    wherein the auxiliary element has a width smaller than a width of the pinned layer and a magnetization direction fixed to a direction the same as a direction of the fixed magnetization direction of the pinned layer.

2. The magnetoresistive element of claim 1, wherein the free layer and the pinned layer have perpendicular magnetic anisotropy.

3. The magnetoresistive element of claim 1, wherein the auxiliary element has a magnetization easy axis perpendicular to an upper surface or a lower surface of the pinned layer.

4. The magnetoresistive element of claim 1, wherein the auxiliary element is perpendicular to an upper surface or a lower surface of the pinned layer.

5. The magnetoresistive element of claim 1, wherein the pinned layer has a thickness equal to, or less than, about 10 nm.

6. The magnetoresistive element of claim 1, wherein the auxiliary element has a thickness equal to, or greater than, about 5 nm.

7. The magnetoresistive element of claim 1, wherein the auxiliary element has a width equal to, or less than, about 10 nm.

8. The magnetoresistive element of claim 1, wherein a plurality of the auxiliary elements are on the pinned layer.

9. The magnetoresistive element of claim 1, wherein the pinned layer is a first pinned layer, and
    the magnetoresistive element further comprises,
    a second pinned layer on a surface of the first pinned layer; and
    a spacer between the first pinned layer and the second pinned layer.

10. The magnetoresistive element of claim 9, wherein the first pinned layer, the second pinned layer, and the spacer collectively constitute a synthetic antiferromagnetic (SAF) structure.

11. The magnetoresistive element of claim 9, wherein a thickness of the second pinned layer is greater than a thickness of the first pinned layer.

12. The magnetoresistive element of claim 9, wherein a plurality of the auxiliary elements are on the surface of the first pinned layer.

13. The magnetoresistive element of claim 12, wherein the plurality of auxiliary elements include,
    a first auxiliary element on a side of the second pinned layer; and
    a second auxiliary element on another side of the second pinned layer.

14. The magnetoresistive element of claim 1, further comprising:
    a separation layer between the free layer and the pinned layer.

15. The magnetoresistive element of claim 14, wherein the separation layer includes an insulation layer.

16. The magnetoresistive element of claim 15, wherein the insulation layer includes at least one of a magnesium (Mg) oxide and an aluminum (Al) oxide.

17. The magnetoresistive element of claim 1, wherein the pinned layer is on the free layer, and
    the auxiliary element is on an upper surface of the pinned layer.

18. The magnetoresistive element of claim 1, wherein the pinned layer is below the free layer, and
    the auxiliary element is on a lower surface of the pinned layer.

19. A memory device, comprising:
    at least one memory cell, wherein the at least one memory cell includes the magnetoresistive element according to claim 1.

20. The memory device of claim 19, wherein the at least one memory cell includes a switching element connected to the magnetoresistive element.

21. The memory device of claim 19, wherein the free layer and the pinned layer of the magnetoresistive element have perpendicular magnetic anisotropy.

22. The memory device of claim 19, wherein the pinned layer of the magnetoresistive element is a first pinned layer, and
    the memory device further comprises,
    a second pinned layer on a surface of the first pinned layer; and
    a spacer between the first pinned layer and the second pinned layer.

23. The memory device of claim 22, wherein the first pinned layer, the second pinned layer, and the spacer collectively constitute a synthetic antiferromagnetic (SAF) structure.

24. The memory device of claim 19, wherein the memory device is a spin transfer torque magnetic random access memory (STT-MRAM).

* * * * *